United States Patent
Penney et al.

(10) Patent No.: US 11,886,715 B2
(45) Date of Patent: *Jan. 30, 2024

(54) MEMORY ARRAY ACCESSIBILITY

(71) Applicant: Lodestar Licensing Group LLC, Evanston, IL (US)

(72) Inventors: Daniel B. Penney, Wylie, TX (US); GAry L. Howe, Plano, TX (US)

( * ) Notice: Subject to any disclaimer, the term of this patent is extended or adjusted under 35 U.S.C. 154(b) by 28 days.

This patent is subject to a terminal disclaimer.

(21) Appl. No.: 17/531,573

(22) Filed: Nov. 19, 2021

(65) Prior Publication Data

US 2022/0083239 A1 Mar. 17, 2022

Related U.S. Application Data

(60) Division of application No. 16/555,293, filed on Aug. 29, 2019, now Pat. No. 11,182,085, which is a (Continued)

(51) Int. Cl.
| | |
|---|---|
| G06F 3/06 | (2006.01) |
| G11C 7/10 | (2006.01) |
| G11C 7/06 | (2006.01) |

(52) U.S. Cl.
CPC .......... *G06F 3/0622* (2013.01); *G06F 3/0644* (2013.01); *G06F 3/0659* (2013.01);
(Continued)

(58) Field of Classification Search
CPC .... G06F 3/0622; G06F 3/0644; G06F 3/0659; G06F 3/0683; G11C 7/065; G11C 7/1006
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| | (Continued) | |

FOREIGN PATENT DOCUMENTS

| | | |
|---|---|---|
| CN | 102141905 | 8/2011 |
| EP | 0214718 | 3/1987 |
| | (Continued) | |

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Zhuo H Li
(74) *Attorney, Agent, or Firm* — Brooks, Cameron & Huebsch, PLLC

(57) ABSTRACT

Apparatuses and methods for memory array accessibility can include an apparatus with an array of memory cells. The array can include a first portion accessible by a controller of the array and inaccessible to devices external to the apparatus. The array can include a second portion accessible to the devices external to the apparatus. The array can include a number of registers that store row address that indicate which portion of the array is the first portion. The apparatus can include the controller configured to access the number of registers to allow access to the second portion by the devices external to the apparatus based on the stored row addresses.

19 Claims, 9 Drawing Sheets

Related U.S. Application Data continuation of application No. 15/691,484, filed on Aug. 30, 2017, now Pat. No. 10,534,553.

(52) U.S. Cl.
CPC ............ *G06F 3/0683* (2013.01); *G11C 7/065* (2013.01); *G11C 7/1006* (2013.01)

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Tazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |

(56) References Cited

U.S. PATENT DOCUMENTS

| | | |
|---|---|---|
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 10,496,311 B2 * | 12/2019 | Greiner ............... G06F 11/3055 |
| 10,534,553 B2 | 1/2020 | Penney et al. |
| 11,182,085 B2 * | 11/2021 | Penney ................. G06F 3/0644 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0204693 A1 | 10/2003 | Moran et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0030824 A1 * | 2/2005 | Kreuchauf ............ G11C 7/1006 |
| | | 365/232 |
| 2005/0078514 A1 | 4/2005 | Scheuerlein et al. |
| 2005/0097417 A1 | 5/2005 | Agrawal et al. |
| 2005/0122822 A1 | 6/2005 | Partsch et al. |
| 2006/0036816 A1 * | 2/2006 | McMahan ............ G06F 12/1458 |
| | | 711/E12.093 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0233984 A1 | 10/2007 | Mondello et al. |
| 2007/0250677 A1 | 10/2007 | Ware et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0159733 A1 | 6/2013 | Lee et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0006692 A1 | 1/2014 | Berntsen et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |

(56) References Cited

U.S. PATENT DOCUMENTS

| | | | |
|---|---|---|---|
| 2016/0154596 | A1 | 6/2016 | Willcock et al. |
| 2016/0155482 | A1 | 6/2016 | La Fratta |
| 2016/0188250 | A1 | 6/2016 | Wheeler |
| 2016/0196142 | A1 | 7/2016 | Wheeler et al. |
| 2016/0196856 | A1 | 7/2016 | Tiwari et al. |
| 2016/0225422 | A1 | 8/2016 | Tiwari et al. |
| 2016/0266873 | A1 | 9/2016 | Tiwari et al. |
| 2016/0266899 | A1 | 9/2016 | Tiwari |
| 2016/0267951 | A1 | 9/2016 | Tiwari |
| 2016/0292080 | A1 | 10/2016 | Leidel et al. |
| 2016/0306584 | A1 | 10/2016 | Zawodny et al. |
| 2016/0306614 | A1 | 10/2016 | Leidel |
| 2016/0365129 | A1 | 12/2016 | Willcock |
| 2016/0371033 | A1 | 12/2016 | La Fratta et al. |
| 2017/0052906 | A1 | 2/2017 | Lea |
| 2017/0178701 | A1 | 6/2017 | Willcock et al. |
| 2017/0192844 | A1 | 7/2017 | Lea et al. |
| 2017/0228192 | A1 | 8/2017 | Willcock et al. |
| 2017/0235515 | A1 | 8/2017 | Lea et al. |
| 2017/0236564 | A1 | 8/2017 | Zawodny et al. |
| 2017/0242902 | A1 | 8/2017 | Crawford et al. |
| 2017/0243623 | A1 | 8/2017 | Kirsch et al. |
| 2018/0357007 | A1 | 12/2018 | Zawodny et al. |
| 2019/0189185 | A1 | 6/2019 | Hush et al. |
| 2023/0129539 | A1* | 4/2023 | Dover .................. G06F 3/0679 711/154 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2018/047862, dated Aug. 24, 2018, 10 pages.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner

TABLE 8-1

| | | 844 | 845 | 856 | 870 | 871 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| 875 → | | 1 | 0 | 1 | 0 | 1 |
| | | 1 | 1 | 1 | 1 | 0 |

TABLE 8-2

| | | | | | | | | | | | |
|---|---|---|---|---|---|---|---|---|---|---|---|
| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*B̄ | A+B | B | AXB | A+B̄ | $\overline{AXB}$ | B̄ | ← 847 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

*Fig. 8*

MEMORY ARRAY ACCESSIBILITY

PRIORITY INFORMATION

This application is a Divisional of U.S. application Ser. No. 16/555,293, filed Aug. 29, 2019, which will issue as U.S. Pat. No. 11,182,085 on Nov. 23, 2021, which is a Continuation of U.S. application Ser. No. 15/691,484, filed Aug. 30, 2017, which issued as U.S. Pat. No. 10,534,553 on Jan. 14, 2020, the contents of which are included herein by reference.

TECHNICAL FIELD

The present disclosure relates generally to semiconductor memory apparatuses and methods, and more particularly, to apparatuses and methods related to memory array accessibility.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be transferred from the memory array to an external processing resource via a bus. Data being transferred between the memory array and an external processing resource can be detected in transit (e.g., by "snooping" pins of a bus). Some approaches to providing security of data transfer can include encrypting/decrypting the data; however, the encryption/decryption process can adversely affect system performance and/or add circuit complexity, among other drawbacks.

BRIEF DESCRIPTION OF THE DRAWINGS

FIG. 8 is a logic table illustrating selectable logic operation results implemented by a sensing circuitry in accordance with a number of embodiments of the present disclosure.

DETAILED DESCRIPTION

Figure 1:
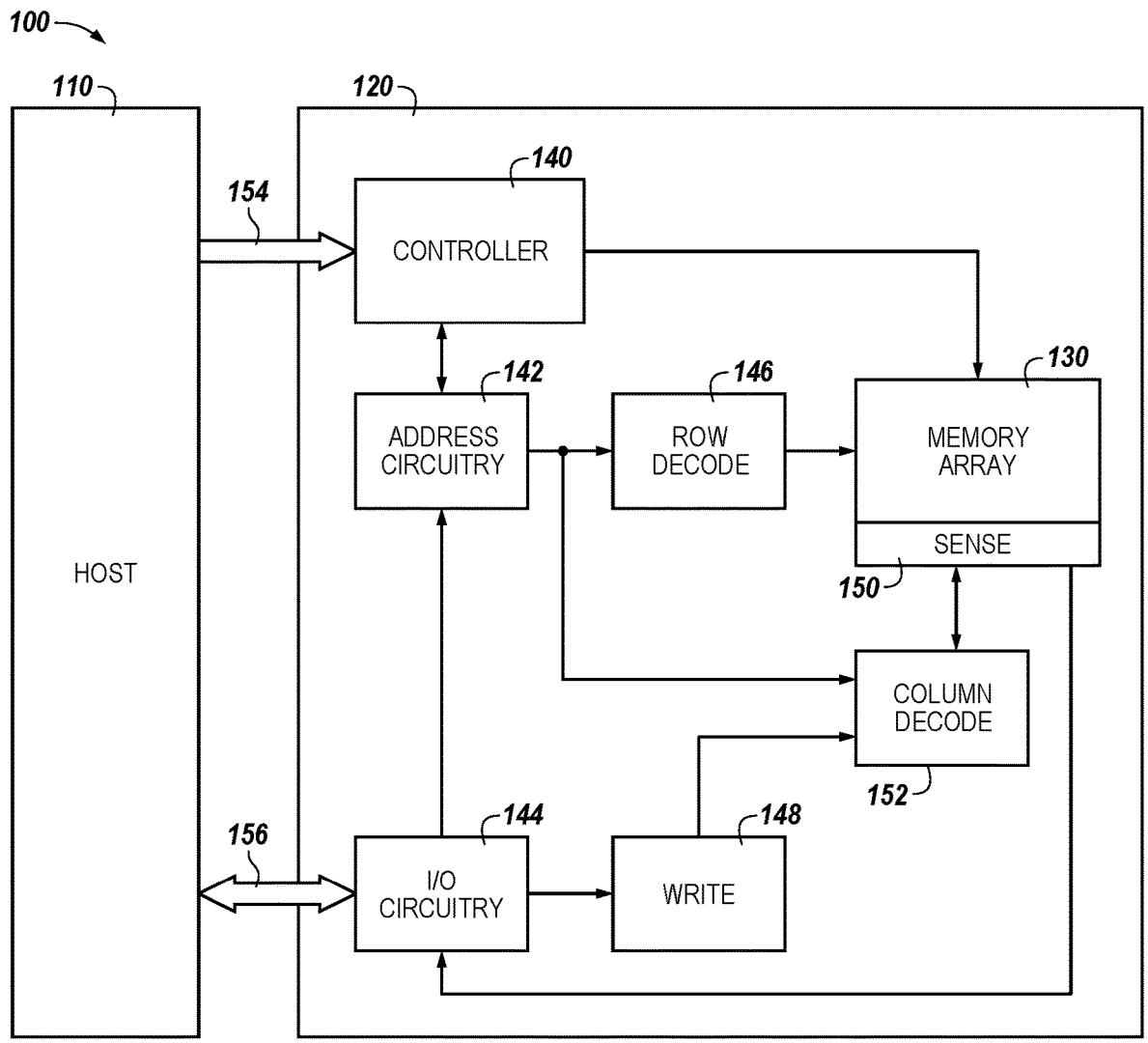
FIG. 1 is a block diagram of an apparatus in the form of a computing system including a memory device in accordance with a number of embodiments of the present disclosure.

An example apparatus comprises an array of memory cells. The array can include a first portion accessible by a controller of the array and inaccessible to devices external to the apparatus. The array can include a second portion accessible to the devices external to the apparatus. The array can include a number of registers that store row address that indicate which portion of the array is the first portion. The apparatus can include the controller configured to access the number of registers to allow access to the second portion by the devices external to the apparatus based on the stored row addresses.

According to various embodiments of the present disclosure, data stored in a memory array can be protected by preventing access to a particular portion of the memory array and allowing access to another portion of the memory array. For example, devices external to a processor-inmemory (PIM) device, such as an external processor, can be prevented from accessing the particular portion (e.g., an inaccessible portion) and the external devices can be allowed access to another portion (e.g., an accessible portion) of the memory array. A number of row registers can include addresses that indicate a boundary of the inaccessible (e.g., protected) portion of the memory array and data corresponding to addresses outside the boundary can be accessible by external devices. In at least one embodiment, the number of row registers may be written only by ISA instruction. As used herein, a PIM device refers to a memory device capable of performing bit-vector operations on bit-vectors stored in an array without transferring data to a processing resource external to the PIM device (e.g., a host processor).

A first row register can store an address that indicates a beginning of the inaccessible portion and a second row register can store an address that indicates an end of the inaccessible portion. The addresses stored in the row registers can be modified in order to dynamically modify the inaccessible portion in response to more or less data being protected in the memory array. As the protected data from the inaccessible portion is not transferred over a bus and/or across pins of the PIM device, the protected data is not accessible by an external device attempting to read the data as it is transferred in order to determine how to access protected data, to change passwords or access to the protected data, to alter instructions in the memory array, etc.

As used herein, a "bit vector operation" is intended to mean an operation that is performed on a bit vector associated with virtual address space and/or physical address space used by a PIM device. Examples of bit-vector operations can include logical operations (e.g., Boolean operations) and/or mathematical operations (e.g., add, subtract, multiply, divide, etc.) among others. FIGS. 6-11, described below, describe operation of the PIM device and further describes how operations are performed without transferring the data external to the PIM device. Maintaining the data in the memory device allows for protection of the data in a first portion of the memory array as the data and/or instructions in the memory array can be executed or operated on without transferring the data along a bus and/or across pins that may be detectable by an external device (e.g., hackers, detection devices, etc.).

In some embodiments, a bit vector may be a physically contiguous number of bits stored physically contiguous in a row and/or in the sensing circuitry of the PIM device. For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components as described herein) formed on pitch with the sense lines selectably coupled to corresponding memory cells in the 16 bit row. A compute component and corresponding sense amplifier in the PIM device may operate as a one bit processing element, as described further in connection with FIG. 6 and elsewhere herein.

A number of embodiments of the present disclosure can provide improved parallelism and/or reduced power consumption in association with performing logical operations as compared to previous systems having an external processor (e.g., a processing resource located external from a memory array, such as on a separate integrated circuit chip). For instance, a number of embodiments can provide for performing operations such as integer add, subtract, multiply, divide, and CAM (content addressable memory) operations without transferring data out of the memory array and sensing circuitry via a bus (e.g., data bus, address bus, control bus), for instance. However, embodiments are not limited to these examples. For instance, a PIM device can perform a number of non-Boolean logic operations such as sense amplifier set, sense amplifier clear, copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the circuitry to perform the compute function. The capability of the PIM device to perform operations (e.g., in association with executing instructions) internal to the memory allows the data to move in the array without being transferred across a bus and/or across pins in order to be processed. In this way, a "monolithic" architecture for protecting data internally in the memory array can be achieved.

Furthermore, in some previous approaches, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on a same pitch with sense lines of the array, which can affect chip size and/or memory density, for example.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, a controller 140, and/or sensing circuitry 150 might also be separately considered an "apparatus."

System 100 includes a host 110 coupled (e.g., connected) to memory device 120, which includes a memory array 130. The memory device 120 can be a PIM device. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 6.

The memory device 120 includes address circuitry 142 to latch address signals provided over an I/O bus 156 (e.g., a data bus) through I/O circuitry 144. Address signals may also be received to controller 140 (e.g., via address circuitry 142 and/or via bus 154). Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of control circuitry. Controller 140 can be implemented in hardware, firmware, and/or software. Controller 140 can also control shifting circuitry, which can be implemented, for example, in the sensing circuitry 150 according to various embodiments.

Examples of the sensing circuitry 150 are described further below. For instance, in a number of embodiments, the sensing circuitry 150 can comprise a number of sense amplifiers (e.g., sense amplifier shown as 606 in FIG. 6, and 706 in FIG. 7) and a number of compute components (e.g., compute component shown as 631 in FIG. 6, and/or 731 in FIG. 7), which can be used to perform bit-vector operations on data stored in array 130. The sense amplifier can comprise a static latch, for example, which can be referred to herein as the primary latch. The compute component 631 can comprise a dynamic and/or static latch, for example, which can be referred to herein as the secondary latch, and which can serve as, and be referred to as, an accumulator.

In a number of embodiments, the sensing circuitry (e.g., 150) can be used to perform operations using data stored in array 130 as inputs and store the results of the logical operations back to the array 130 without transferring data via a sense line address access (e.g., without firing a column decode signal). As such, various logical functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform logical operations using the operands, and the result would be transferred back to the array (e.g., 130) via the I/O lines. In contrast, in a number of embodiments of the present disclosure, sensing circuitry (e.g., 150) is configured to perform bit-vector operations (e.g., logical operations) on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, various circuitry external to array 130 and sensing circuitry 150 (e.g., external registers associated with an ALU) is not needed to perform logical functions as the sensing circuitry 150 can perform the appropriate logical operations to perform such logical functions without the use of an external processing resource. In this way, instructions in the array 130 can be executed internal to the array 130 on data stored in the array 130 without transferring the data out of the array and exposing the data to possible detection, interception, hacking, etc. The data and instructions can be protected in a portion of the array that is inaccessible to external devices and additional portions of the array 130 storing unprotected data can be accessible.

Further, the sensing circuitry 150 may be used to complement and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
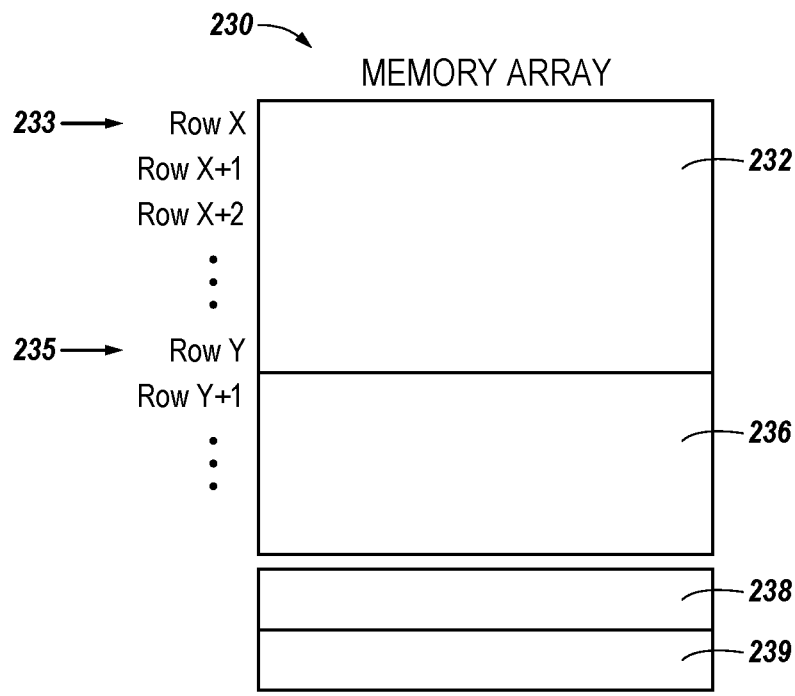
FIG. 2 illustrates a schematic diagram of a portion of a memory array in accordance with a number of embodiments of the present disclosure.

FIG. 2 illustrates a schematic diagram of a portion of a memory array 230 in accordance with a number of embodiments of the present disclosure. The memory array 230 can be a DRAM array, SRAM array, STT RAM array, PCRAM array, TRAM array, RRAM array, NAND flash array, and/or NOR flash array, for instance. The array 230 can comprise memory cells arranged in rows coupled by access lines (which may be referred to herein as word lines or select lines) and columns coupled by sense lines. Although a single array 230 is shown in FIG. 2, embodiments are not so limited. For instance, a memory device (such as memory device 120 in FIG. 1) may include a number of arrays 130 (e.g., a number of banks of DRAM cells). An example DRAM array is described in association with FIG. 7.

The memory array 230 can include a first portion 232 and a second portion 236. The first portion 232 can include a number of rows of memory cells, illustrated as Row X 233 to Row Y 235, that are inaccessible (e.g., protected) to devices external to a memory device (such as memory device 120). As an example, devices external to the memory device cannot access data stored in the first portion 232, cannot execute instructions stored in the first portion 232, and cannot read and/or write data into or from the first portion 232. The first portion 232 is accessible internal to the memory device (such as memory device 120) by a controller (e.g., controller 140), for example. The first portion 232 can store data and/or instructions executable by the controller. The data and/or instructions that originated from the first portion 232 can be prevented from being read when in the processor in order to protect the data and/or instructions, even when read by the processor internal to the memory device.

The instructions can refer to instruction set architecture (ISA) instructions which can be binary coded instructions accepted by a PIM device to perform various bit-vector operations. An ISA refers to an interface or boundary between software and hardware. In general, a program executable on the PIM device can comprise a set of ISA instructions and data (e.g., operands). The ISA can allow multiple implementations that may vary in performance, physical size, and cost. Instructions stored in the first portion 232 can use data stored in the first portion 232 and the second portion 236 for executing the instructions (e.g., use the data as operands). Instructions stored in the first portion 232 can be prevented from being executed in the second portion 236 or additional locations external to the memory device. Instructions (e.g., DRAM activate (ACT) instructions) originating external to the first portion 232 can be prevented from being executed in the first portion 232. Instructions that are internal to a PIM device (e.g., PIM DRAM activate (ACT) instructions) can be prevented from being executed outside the first portion 323. In at least one embodiment, instructions can be executed to store data results in the second portion 236. Data stored into the second portion 236 by a device external to the PIM device can only be stored in the first portion 232 by execution of an instruction in the first portion 232.

The second portion 236 can include a number of rows, Row Y+1 to Row Y+N. The second portion 236 can store data accessible to the memory device (e.g., memory device 120) and devices external to the memory device. In order to transfer data stored in the first portion 232 to an external device, data can be transferred to the second portion 236 and transferred from the second portion 236 to the external device. In order to use a set of data from an external device, the set of data from the external device can be transferred to the second portion 236 and instructions stored in the first portion 232 can be executed using the set of data.

In at least some embodiments, the second portion 236 can be prevented from storing instructions in the second portion 236. In this way, instructions can be limited to being executed from the first portion 232 and not from the second portion 236. Data stored in the second portion 236 can be recognized solely as data (e.g., operands) and not as instructions. If an external device has added incorrect or false data to the second portion 236, executing instructions from the first portion 232 may cause an error or incorrect results but will not allow access or modification of the instructions in the first portion 232. Since data is accessible in the second portion 236, storing only data, and not instructions, in the second portion 236 prevents instructions from being stored in and executed from within the second portion 236 by an external device.

The memory array 230 can include registers 238, 239 that store addresses associated with the first portion 232 and provide access control to the first portion 232. The registers 238, 239 can be stored in a periphery of the array 230 of memory cells (e.g., in cells not storing operand data). A first register 238 stores a row address of an initial row of cells storing data in the first portion 232. A second register 239 stores a row address of an ending row of cells storing data in the first portion 232. In this way, the row addresses stored in the first register 238 and the second register 236 define boundaries of the first portion 232 that are inaccessible to external devices. The registers 238, 239 are only accessible by executing instructions (e.g., ISA instructions) stored in the first portion 232. The registers 238, 239 are only written to during a particular phase, described in association with FIG. 4, when the registers 238, 239 are initially loaded. The registers 238, 239, once initially loaded, can no longer be written to until a particular process may clear the registers (e.g., a reset).

In at least one embodiment, the second portion 236 can store instructions that are executed by a controller without reading or writing data resulting from the execution into the first portion 232. In this way, the data and/or instructions stored in the first portion 232 is protected from modification from instructions stored and executed in the second portion 236.

In response to a reset (e.g., soft or hard reset) of the memory device, the first portion 232 can be cleared (e.g., reset). In this way, in response to the row registers 238, 239 defining the boundary of the first portion 232 being reset, the data within the first portion 232 is also cleared. Otherwise, when the row registers 238, 239 are reset, the boundaries of the first portion 232 that protect the data may be cleared and the data in the first portion 232 would be accessible by an external device, and therefore unprotected. By resetting the data of the first portion 232, the data previously stored in the first portion 232 is protected upon a reset of the memory device.

The memory device (e.g., memory device 120 in FIG. 1) including the memory array 230 can include a fuse that is defaulted to disable the row registers 238, 239 and not use them to define the first portion 232. Once the fuse is deactivated, the row registers 238, 239 can be activated to be used to define the first portion 232.

Figure 3:
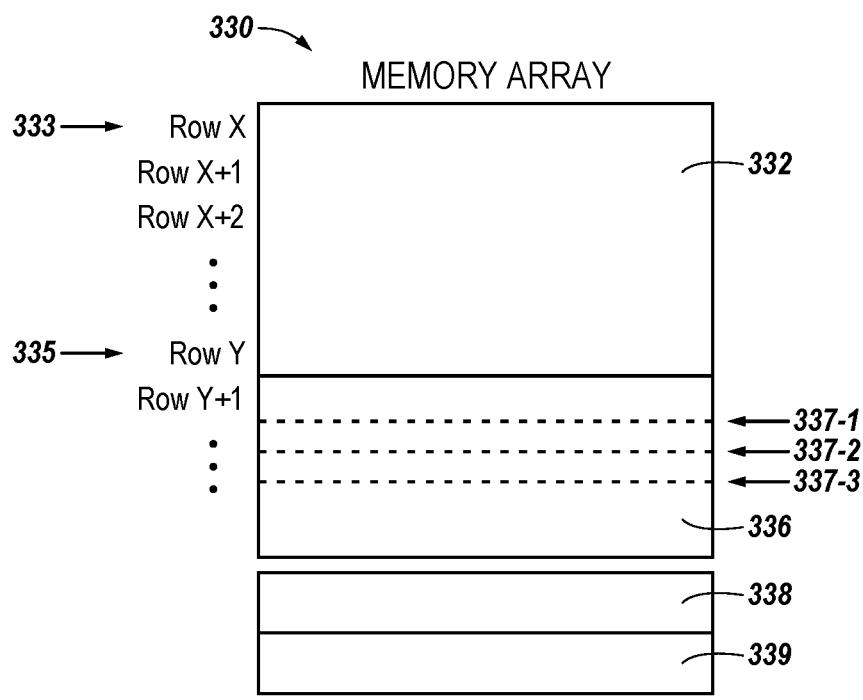
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The memory array 330 can include a first portion 332 and a second portion 336. The first portion 332 can include a number of rows of memory cells, illustrated as Row X (333) to Row Y (335), that are inaccessible (e.g., protected) to devices external to a memory device (such as memory device 120). The first portion 332 is accessible internal to the memory device (such as memory device 120) by a controller (e.g., controller 140), for example. The first portion 232 can store data and/or instructions executable by the controller. The second portion 236 can include a number of rows Row Y+1 to Row N. The second portion 236 can store data accessible to the memory device (e.g., memory device 120) and devices external to the memory device.

The memory array 330 can include registers 338, 339 that store addresses associated with the first portion 332 and provide access control to the first portion 332. The registers 338, 339 can be stored in a periphery of the array 330 of memory cells (e.g., in cells not storing operand data). A first register 338 stores a row address of an initial row of cells storing data in the first portion 332. A second register 339 stores a row address of an ending row of cells storing data in the first portion 332. In this way, the row addresses stored in the first register 338 and the second register 336 define boundaries of the first portion 332 that are inaccessible to external devices.

The row addresses stored in the first register 338 and the second register 339 can be modified in order to modify which cells of the array 330 are in the first portion 232 of cells and thereby modify which cells are inaccessible to the external device. For example, the address stored in the second row register 338 can be modified from being associated with Row Y (235) in FIG. 2 to being associated with row 337-1 to add additional rows of cells into the first portion 332. An additional modification can include modifying the address stored in the second row register 338 to being associated with row 337-2 to add additional rows of cells and a further modification can include modifying the address to being associated with row 337-3.

In this way, the amount of rows of cells can be decreased to a size between Row X 333 and row 337-1, increased to an amount of rows between Row X and row 337-2, and further increased to an amount of rows between Row X and row 337-3. Modifications can be made based on an amount of data to be protected in the first portion 332. The row registers 338, 339 can be writeable by ISA instruction. The row registers 338, 339 can be writeable by the ISA instruction that is executed from the first portion 332. By modifying the size of the first portion 332, the memory array 330 can dynamically protect an amount of data based on the size of data and is not limited by a size of the first portion 332.

Figure 4:
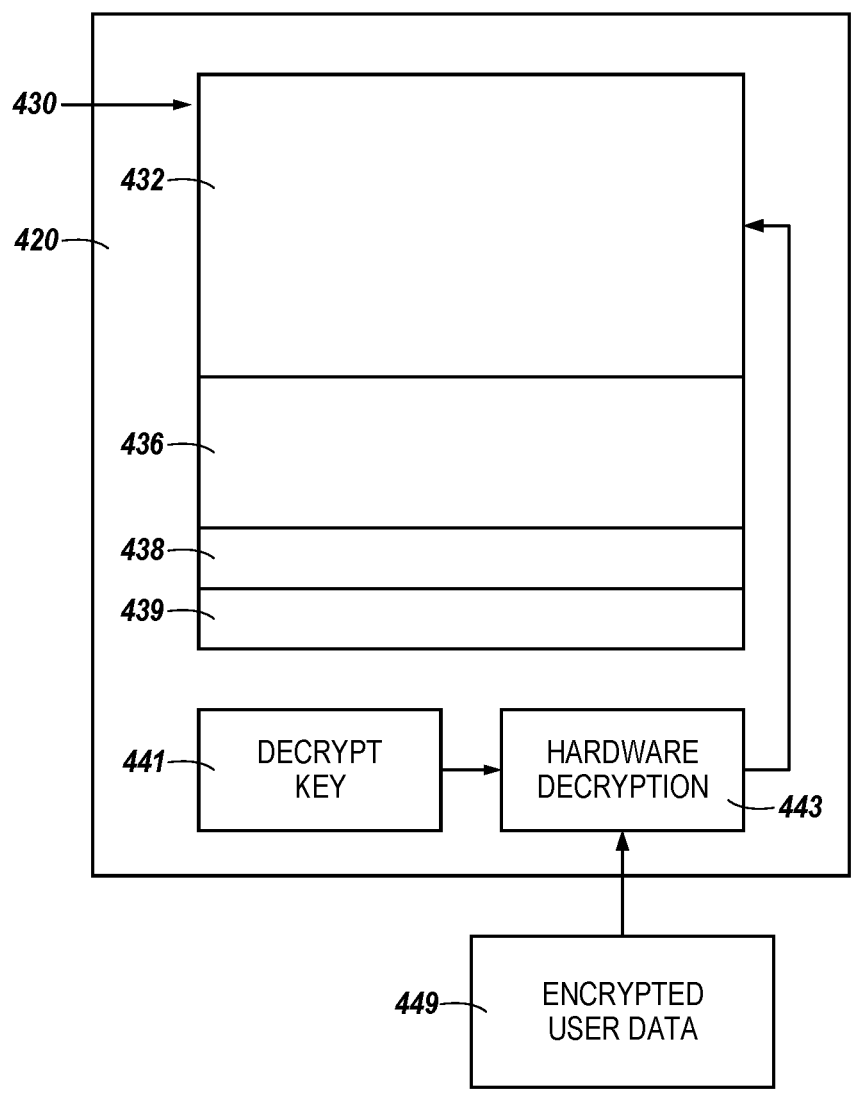
FIG. 4 illustrates a schematic diagram of a portion of a memory array in accordance with a number of embodiments of the present disclosure.

FIG. 4 illustrates a schematic diagram of a portion of a memory system 404 in accordance with a number of embodiments of the present disclosure. The memory system 404 can include a memory device (e.g., a PIM device) 420 and encrypted user data 449 stored on a hard drive. The memory device 420 can include a memory array 430, a decrypt key 441, and a hardware decryption engine 443.

The memory array 430 can include a first portion (e.g., inaccessible portion) 432, a second portion (accessible portion) 436, and row registers 438, 439. The decrypt key 441 can be used to trigger a fuse in the memory device 420 that indicates to use row registers 438, 439 to define the rows of the first portion 432. The row registers 438, 439, initially, can indicate to allow access to the first portion 432 while data is initially loaded into the first portion. In this way, the data to be protected is loaded into the first portion 432. The encrypted user data 449 can be used to load into the first portion 432 and be protected by limited access. Once the data to be protected is loaded into the first portion 432, the row registers 438, 439 are reset and will not allow data to be written to the first portion 432, and therefore remain protected.

Figure 5:
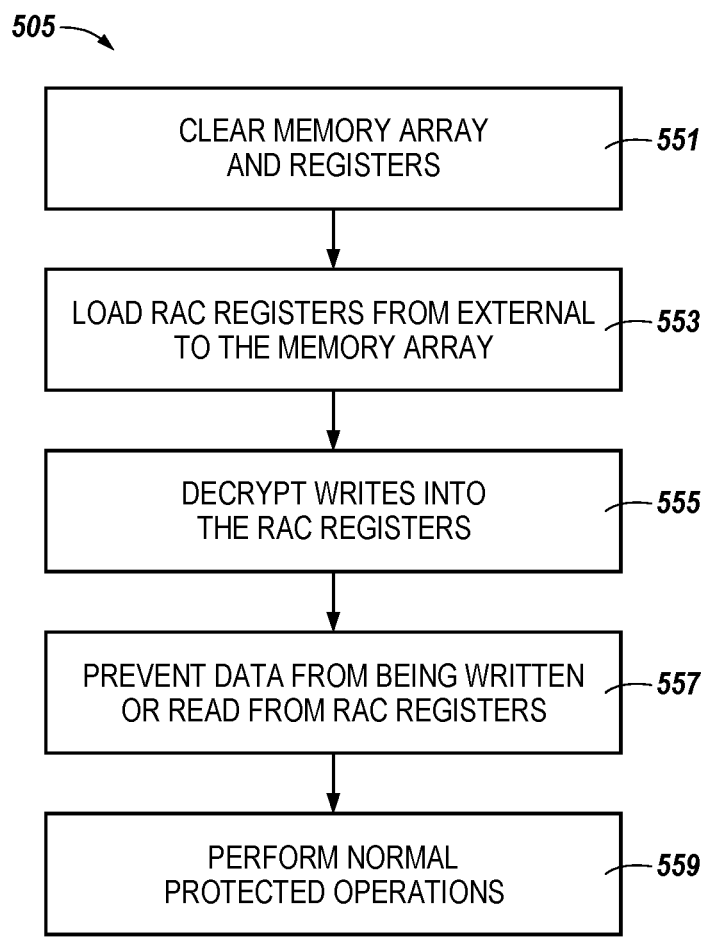
FIG. 5 illustrates a schematic diagram of an example method of memory array accessibility in accordance with a number of embodiments of the present disclosure.

FIG. 5 illustrates a schematic diagram of an example method 505 of memory array accessibility in accordance with a number of embodiments of the present disclosure. The method 505 can include, at 551, clearing a memory array (e.g., memory array 230, 330, 430 in FIGS. 2-4, respectively) and registers (e.g., registers 238, 239, 338, 339, 438, 439 in FIGS. 2-4, respectively). In at least one embodiment, a first portion (e.g., first portion 232, 332, 432) and a second portion (e.g., second portion 236, 336, 436) can be cleared. In at least one embodiment, the first portion can be cleared and the second portion is not cleared.

The method 505 can include, at 553, loading (RAC) registers (e.g., registers 238, 239, 338, 339, 438, 439 in FIGS. 2-4, respectively) from an external device to a memory array (e.g., memory array 130, 230, 330, 430, in FIGS. 1-4, respectively). The data loaded into the registers can indicate a section of the memory array that makes up the first portion of the memory array. The data can include a row address that indicates a first, initial row of the first portion and a row address that indicates a last row of the first portion. The data can indicate boundaries the define the rows of the first portion in the memory array.

The method 505 can include, at 555, decrypting writes into the first portion. The writes can be allowed by reversing the normal process of preventing writes or reads into the first portion initially, as data to be protected will be written to the first portion at some point or there would be no data ever written there to protect. The writes can be data from an external device and/or a controller of the memory device (such as memory device 120 in FIG. 1). The written data can be data indicated to be protected by the memory array. The data is written into the first portion of the memory array as the first portion will have limited access (e.g., external devices will not have access to the first portion).

The method 505 can include, at 557, preventing data from being written or read from the first portion. In response to the initial data being written to the first portion, the registers that indicate which rows make up the first portion indicate to not write or read data to or from the first portion. This reversal, from allowing external data to be initially written to not allowing any data to be written or read results in the limited access and therefore protection of the data written to the first portion.

The method 505 can include, at 559, performing normal protected operations. The protected operations can include executing instructions stored in the first portion on data (e.g., operands) stored in either of the first portion and the second portion. The protected operations can include preventing external devices from accessing the first portion while performing execution of the instructions in the first portion. The protected operations can include preventing instructions stored external to the first portion from executing in the first portion. The protected operations can include preventing instructions from the first portion from executing outside the first portion. In this way, the data stored in the first portion is prevented from being snooped or detected by hackers. The instructions and/or data stored in the first portion can be prevented from being read and no instructions and/or data can be written to the first portion. In order to access data in the first portion, the data could first be written to the second portion and then read out of the second portion.

Figure 6:
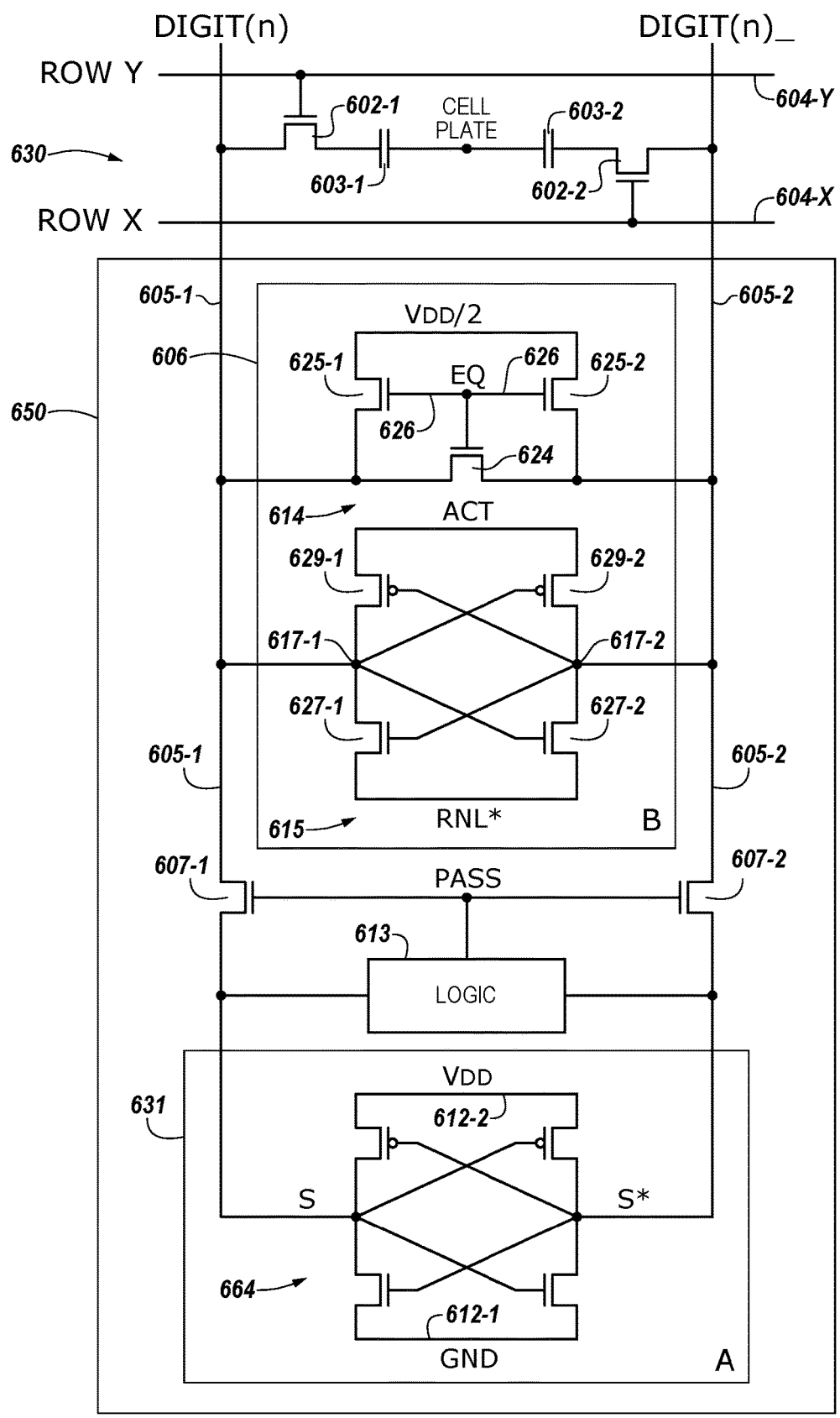
FIG. 6 is a schematic diagram illustrating sensing circuitry in accordance with a number of embodiments of the present disclosure.

FIG. 6 is a schematic diagram illustrating sensing circuitry in accordance with a number of embodiments of the present disclosure. A memory cell comprises a storage element (e.g., capacitor) and an access device (e.g., transistor). For instance, transistor 602-1 and capacitor 603-1 comprise a memory cell, and transistor 602-2 and capacitor 603-2 comprise a memory cell, etc. In this example, the memory array 630 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 630 can be arranged in rows coupled by word lines 604-X (ROW X), 604-Y (ROW Y), etc., and columns coupled by pairs of complementary sense lines (e.g., data lines DIGIT(n)/DIGIT(n)_). The individual sense lines corresponding to each pair of complementary sense lines can also be referred to as data lines 605-1 (D) and 605-2 (D_) respectively. Although only one pair of complementary data lines (e.g., one column) are shown in FIG. 6, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 602-1 can be coupled to data line 605-1 (D), a second source/drain region of transistor 602-1 can be coupled to capacitor 603-1, and a gate of a transistor 602-1 can be coupled to word line 604-Y. A first source/drain region of a transistor 602-2 can be coupled to data line 605-2 (D), a second source/drain region of transistor 602-2 can be coupled to capacitor 603-2, and a gate of a transistor 602-2 can be coupled to word line 604-X. The cell plate, as shown in FIG. 6, can be coupled to each of capacitors 603-1 and 603-2. The cell plate can be a common node to which a reference voltage (e.g., ground) can be applied in various memory array configurations.

The memory array 630 is coupled to sensing circuitry 650 in accordance with a number of embodiments of the present disclosure. In this example, the sensing circuitry 650 comprises a sense amplifier 606 and a compute component 631 corresponding to respective columns of memory cells (e.g., coupled to respective pairs of complementary data lines). The sensing circuitry 650 can correspond to sensing circuitry 150 shown in FIG. 1, for example. The sense amplifier 606 can be coupled to the pair of complementary sense lines 605-1 and 605-2. The compute component 631 can be coupled to the sense amplifier 606 via pass gates 607-1 and 607-2. The gates of the pass gates 607-1 and 607-2 can be coupled to logical operation selection logic 613.

The logical operation selection logic 613 can be configured to include pass gate logic for controlling pass gates that couple the pair of complementary sense lines 605-1 and 605-2 un-transposed between the sense amplifier 606 and the compute component 631 (as shown in FIG. 6) and/or swap gate logic for controlling swap gates that couple the pair of complementary sense lines transposed between the sense amplifier 606 and the compute component 631 (as is discussed later with respect to FIG. 7, for example). The logical operation selection logic 613 can also be coupled to the pair of complementary sense lines 605-1 and 605-2. The logical operation selection logic 613 can be configured to control pass gates 607-1 and 607-2 (e.g., to control whether the pass gates 607-1 and 607-2 are in a conducting state or a non-conducting state) based on a selected logical operation, as described in detail below for various configurations of the logical operation selection logic 613.

The sense amplifier 606 can be operated to determine a data value (e.g., logic state) stored in a selected memory cell. The sense amplifier 606 can comprise a cross coupled latch, which can be referred to herein as a primary latch. In the example illustrated in FIG. 6, the circuitry corresponding to sense amplifier 606 comprises a latch 615 including four transistors coupled to the pair of complementary data lines 605-1 and 605-2. However, embodiments are not limited to this example. The latch 615 can be a cross coupled latch (e.g., gates of a pair of transistors, such as n-channel transistors (e.g., NMOS transistors) 627-1 and 627-2 are cross coupled with the gates of another pair of transistors, such as p-channel transistors (e.g., PMOS transistors) 629-1 and 629-2).

In operation, when a memory cell is being sensed (e.g., read), the voltage on one of the data lines 605-1 (D) or 605-2 (D_) will be slightly greater than the voltage on the other one of data lines 605-1 (D) or 605-2 (D). An ACT signal can be driven high and the RNL* signal can be driven low to enable (e.g., fire) the sense amplifier 606. The data line 605-1 (D) or 605-2 (D_) having the lower voltage will turn on one of the PMOS transistor 629-1 or 629-2 to a greater extent than the other of PMOS transistor 629-1 or 629-2, thereby driving high the data line 605-1 (D) or 605-2 (D_) having the higher voltage to a greater extent than the other data line 605-1 (D) or 605-2 (D_) is driven high.

Similarly, the data line 605-1 (D) or 605-2 (D_) having the higher voltage will turn on one of the NMOS transistor 627-1 or 627-2 to a greater extent than the other of the NMOS transistor 627-1 or 627-2, thereby driving low the data line 605-1 (D) or 605-2 (D_) having the lower voltage to a greater extent than the other data line 605-1 (D) or 605-2 (D_) is driven low. As a result, after a short delay, the data line 605-1 (D) or 605-2 (D_) having the slightly greater voltage is driven to the voltage of the supply voltage $V_{DD}$ (e.g., through a source transistor (not shown)), and the other data line 605-1 (D) or 605-2 (D_) is driven to the voltage of the reference voltage (e.g., to ground (GND) through a sink transistor (not shown)). Therefore, the cross coupled NMOS transistors 627-1 and 627-2 and PMOS transistors 629-1 and 629-2 serve as a sense amplifier pair, which amplify the differential voltage on the data lines 605-1 (D) and 605-2 (D_) and operate to latch a data value sensed from the selected memory cell.

Embodiments are not limited to the sense amplifier 606 configuration illustrated in FIG. 6. As an example, the sense amplifier 606 can be current-mode sense amplifier and/or single-ended sense amplifier (e.g., sense amplifier coupled to one data line). Also, embodiments of the present disclosure are not limited to a folded data line architecture such as that shown in FIG. 6.

The sense amplifier 606 can, in conjunction with the compute component 631, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations associated therewith using less power than various previous approaches. Additionally, since a number of embodiments can eliminate the need to transfer data across I/O lines in order to perform logical functions (e.g., between memory and discrete processor), a number of embodiments can enable an increased parallel processing capability as compared to previous approaches.

The sense amplifier 606 can further include equilibration circuitry 614, which can be configured to equilibrate the data lines 605-1 (D) and 605-2 (D). In this example, the equilibration circuitry 614 comprises a transistor 624 coupled between data lines 605-1 (D) and 605-2 (D). The equilibration circuitry 614 also comprises transistors 625-1 and 625-2 each having a first source/drain region coupled to an equilibration voltage (e.g., $V_{DD}/2$), where $V_{DD}$ is a supply voltage associated with the array. A second source/drain region of transistor 625-1 can be coupled data line 605-1 (D), and a second source/drain region of transistor 625-2 can be coupled data line 605-2 (D). Gates of transistors 624, 625-1, and 625-2 can be coupled together, and to an equilibration (EQ) control signal line 626. As such, activating EQ enables the transistors 624, 625-1, and 625-2, which effectively shorts data lines 605-1 (D) and 605-2 (D_) together and to the an equilibration voltage (e.g., $V_{DD}/2$).

Although FIG. 6 shows sense amplifier 606 comprising the equilibration circuitry 614, embodiments are not so limited, and the equilibration circuitry 614 may be implemented discretely from the sense amplifier 606, implemented in a different configuration than that shown in FIG. 6, or not implemented at all.

As described further below, in a number of embodiments, the sensing circuitry (e.g., sense amplifier 606 and compute component 631) can be operated to perform a selected logical operation and initially store the result in one of the sense amplifier 606 or the compute component 631 without transferring data from the sensing circuitry via an I/O line (e.g., without performing a data line address access via activation of a column decode signal, for instance).

As shown in FIG. 6, the compute component 631 can also comprise a latch 664, which can be referred to herein as a secondary latch. The secondary latch 664 can be configured and operated in a manner similar to that described above with respect to the primary latch 615, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 6 at 631, and various other embodiments are described further below.

Figure 7:
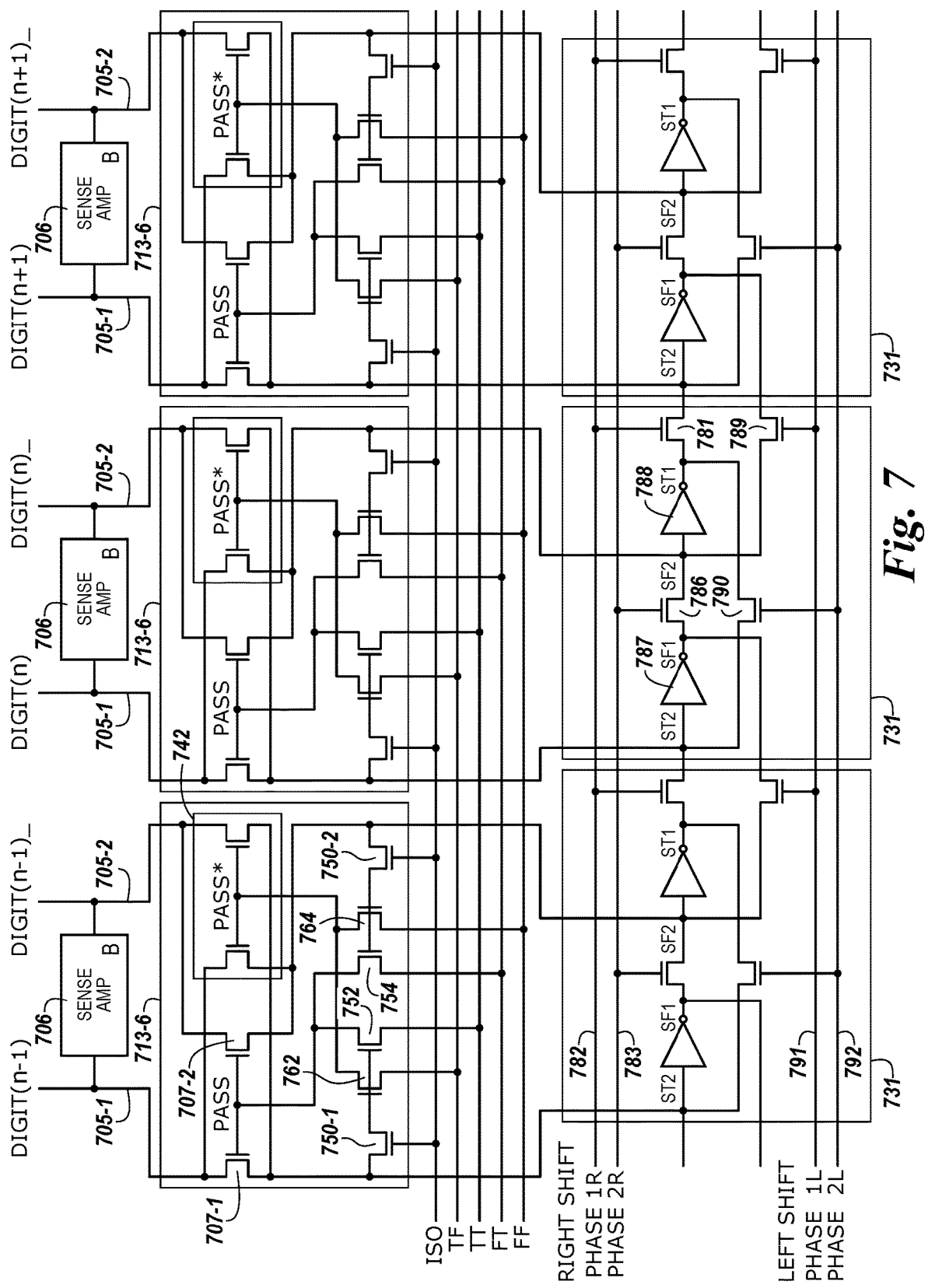
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a number of sense amplifiers 706 coupled to respective pairs of complementary sense lines 705-1 and 705-2, and a corresponding number of compute component 731 coupled to the sense amplifiers 706 via pass gates 707-1 and 707-2. The gates of the pass gates 707-1 and 707-2 can be controlled by a logical operation selection logic signal, PASS. For example, an output of the logical operation selection logic 713-6 can be coupled to the gates of the pass gates 707-1 and 707-2.

According to the embodiment illustrated in FIG. 7, the compute components 731 can comprise respective stages (e.g., shift cells) of a loadable shift register configured to shift data values left and right. According to some embodiments, the compute component 731 can have bidirectional shift capabilities. According to various embodiments of the present disclosure, the compute components 731 can comprise a loadable shift register (e.g., with each compute component 731 serving as a respective shift stage) configured to shift in multiple directions (e.g., right and left). According to various embodiments of the present disclosure, the compute components 731 can comprise respective stages (e.g., shift cells) of a loadable shift register configured to shift in one direction. The loadable shift register can be coupled to the pairs of complementary sense lines 705-1 and 705-2, with node ST2 of each stage being coupled to the sense line (e.g., DIGIT(n)) communicating a true data value and with node SF2 of each stage being coupled to the sense line (e.g., DIGIT(n)_) communicating a complementary (e.g., false) data value.

According to some embodiments and as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 731 in association with performing logical operations and/or shifting data in accordance with embodiments described herein. Examples of shifting data (e.g., from a particular compute component 731 to an adjacent compute component 731) is described further below with respect to FIGS. 9 and 10.

The compute components 731 (e.g., stages) of the loadable shift register can comprise a first right-shift transistor 781 having a gate coupled to a first right-shift control line 780 (e.g., "PHASE 1R"), and a second right-shift transistor 786 having a gate coupled to a second right-shift control line 782 (e.g., "PHASE 2R"). Node ST2 of each stage of the loadable shift register is coupled to an input of a first inverter 787. The output of the first inverter 787 (e.g., node SF1) is coupled to one source/drain of the second right-shift transistor 786, and another source/drain of the second right-shift transistor 786 is coupled to an input of a second inverter 788 (e.g., node SF2). The output of the second inverter 788 (e.g., node ST1) is coupled to one source/drain of the first right-shift transistor 781, and another source/drain of the first right-shift transistor 781 is coupled to an input of a second inverter (e.g., node SF2) for an adjacent compute component 731. Latch transistor 785 has a gate coupled to a LATCH control signal 784. One source/drain of the latch transistor 785 is coupled to node ST2, and another source/drain of the latch transistor 785 is coupled to node ST1.

Sense amplifiers 706 can be coupled to respective pairs of complementary sense lines 705-1 and 705-2, and corresponding compute components 731 coupled to the sense amplifiers 706 via respective pass gates 707-1 and 707-2. The gates of the pass gates 707-1 and 707-2 can be controlled by respective logical operation selection logic signals, "Passd" and "Passdb," which can be output from logical operation selection logic (not shown for clarity).

A first left-shift transistor 789 is coupled between node SF2 of one loadable shift register to node SF1 of a loadable shift register corresponding to an adjacent compute component 731. The channel of second left-shift transistor 790 is coupled from node ST2 to node ST1. The gate of the first left-shift transistor 789 is coupled to a first left-shift control line 791 (e.g., "PHASE 1L"), and the gate of the second left-shift transistor 790 is coupled to a second left-shift control line 792 (e.g., "PHASE 2L").

Figure 10:
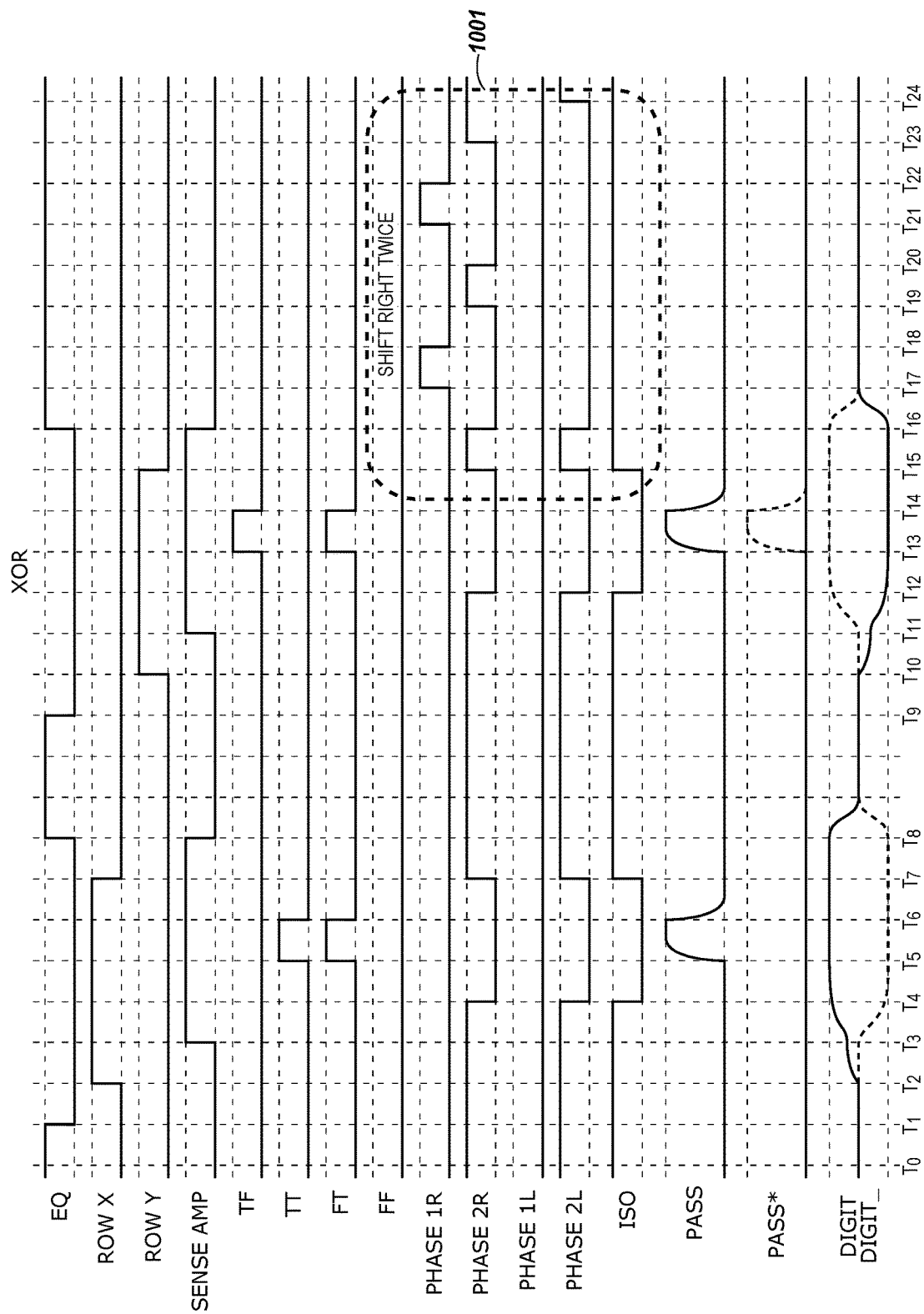
FIG. 10 illustrates a timing diagram associated with performing a logical operation and a shifting operation using the sensing circuitry in accordance with a number of embodiments of the present disclosure.

The logical operation selection logic 713-6 includes the swap gates 742, as well as logic to control the pass gates 707-1 and 707-2 and the swap gates 742. The logical operation selection logic 713-6 includes four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line). FIGS. 10 and 11 illustrate timing diagrams associated with performing logical operations and shifting operations using the sensing circuitry shown in FIG. 7.

Data values on the respective pairs of complementary sense lines 705-1 and 705-2 can be loaded into the corresponding compute components 731 (e.g., loadable shift register) by causing the pass gates 707-1 and 707-2 to conduct, such as by causing the Passd control signal to go high. Gates that are controlled to have continuity (e.g., electrical continuity through a channel) are conducting, and can be referred to herein as being OPEN. Gates that are controlled to not have continuity (e.g., electrical continuity through a channel) are said to be non-conducting, and can be referred to herein as being CLOSED. For instance, continuity refers to a low resistance condition in which a gate is conducting. The data values can be loaded into the respective compute components 731 by either the sense amplifier 706 overpowering the corresponding compute component 731 (e.g., to overwrite an existing data value in the compute component 731) and/or by turning off the PHASE 1R and PHASE 2R control signals 780 and 782 and the LATCH control signal 784. A first latch (e.g., sense amplifier) can be configured to overpower a second latch (e.g., compute component) when the current provided by the first latch and presented to the second latch is sufficient to flip the second latch.

The sense amplifier 706 can be configured to overpower the compute component 731 by driving the voltage on the pair of complementary sense lines 705-1 and 705-2 to the maximum power supply voltage corresponding to a data value (e.g., driving the pair of complementary sense lines 705-1 and 705-2 to the rails), which can change the data value stored in the compute component 731. According to a number of embodiments, the compute component 731 can be configured to communicate a data value to the pair of complementary sense lines 705-1 and 705-2 without driving the voltages of the pair of complementary sense lines 705-1 and 705-2 to the rails (e.g., to $V_{DD}$ or GND). As such, the compute component 731 can be configured to not overpower the sense amplifier 706 (e.g., the data values on the pair of complementary sense lines 705-1 and 705-2 from the compute component 731 will not change the data values stored in the sense amplifier 706 until the sense amplifier is enabled.

Once a data value is loaded into a compute component 731 of the loadable shift register, the true data value is separated from the complement data value by the first inverter 787. The data value can be shifted to the right (e.g., to an adjacent compute component 731) by alternate operation of first right-shift transistor 781 and second right-shift transistor 786, which can be accomplished when the first right-shift control line 780 and the second right-shift control line 782 have periodic signals that go high out-of-phase from one another (e.g., non-overlapping alternating square waves 180 degrees out of phase with one another). LATCH control signal 784 can be activated to cause latch transistor 785 to conduct, thereby latching the data value into a corresponding compute component 731 of the loadable shift register (e.g., while signal PHASE 1R remains low and PHASE 2R remains high to maintain the data value latched in the compute component 731).

FIG. 8 is a logic table illustrating selectable logic operation results implemented by a sensing circuitry (e.g., sensing circuitry shown in FIGS. 6 and 7) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 606 and compute component 631. The four control signals (e.g., TF, TT, FT, and FF), in conjunction with a particular data value present on the complementary sense lines (e.g., on nodes S and S*), controls the pass gates 707-1 and 707-2 and swap transistors 742, which in turn affects the data value in the compute component 731 and/or sense amplifier 706 before/after firing. The capability to selectably control the swap transistors 742 facilitates implementing logical operations involving inverse data values (e.g., inverse operands and/or inverse result), among others.

Logic Table 8-1 illustrated in FIG. 8 shows the starting data value stored in the compute component 631 shown in column A at 844, and the starting data value stored in the sense amplifier 606 shown in column B at 845. The other 3 column headings in Logic Table 8-1 refer to the state of the pass gates 607-1 and 607-2 and the swap transistors 742, which can respectively be controlled to be OPEN or CLOSED depending on the state of the four logic selection control signals (e.g., TF, TT, FT, and FF), in conjunction with a particular data value present on the pair of complementary sense lines 605-1 and 605-2 when the ISO control signal is asserted. The "NOT OPEN" column corresponds to the pass gates 607-1 and 607-2 and the swap transistors 742 both being in a non-conducting condition, the "OPEN TRUE" column corresponds to the pass gates 607-1 and 607-2 being in a conducting condition, and the "OPEN INVERT" column corresponds to the swap transistors 742 being in a conducting condition. The configuration corresponding to the pass gates 607-1 and 607-2 and the swap transistors 742 both being in a conducting condition is not reflected in Logic Table 8-1 since this results in the sense lines being shorted together.

Via selective control of the pass gates 707-1 and 707-2 and the swap transistors 742, each of the three columns of the upper portion of Logic Table 8-1 can be combined with each of the three columns of the lower portion of Logic Table 8-1 to provide nine (e.g., 3×3) different result combinations, corresponding to nine different logical operations, as indicated by the various connecting paths shown at 875. The nine different selectable logical operations that can be implemented by the sensing circuitry 650 are summarized in Logic Table 8-2.

The columns of Logic Table 8-2 show a heading 880 that includes the states of logic selection control signals (e.g., FF, FT, TF, TT). For example, the state of a first logic selection control signal (e.g., FF) is provided in row 876, the state of a second logic selection control signal (e.g., FT) is provided in row 877, the state of a third logic selection control signal (e.g., TF) is provided in row 878, and the state of a fourth logic selection control signal (e.g., TT) is provided in row 879. The particular logical operation corresponding to the results is summarized in row 847.

Figure 9:
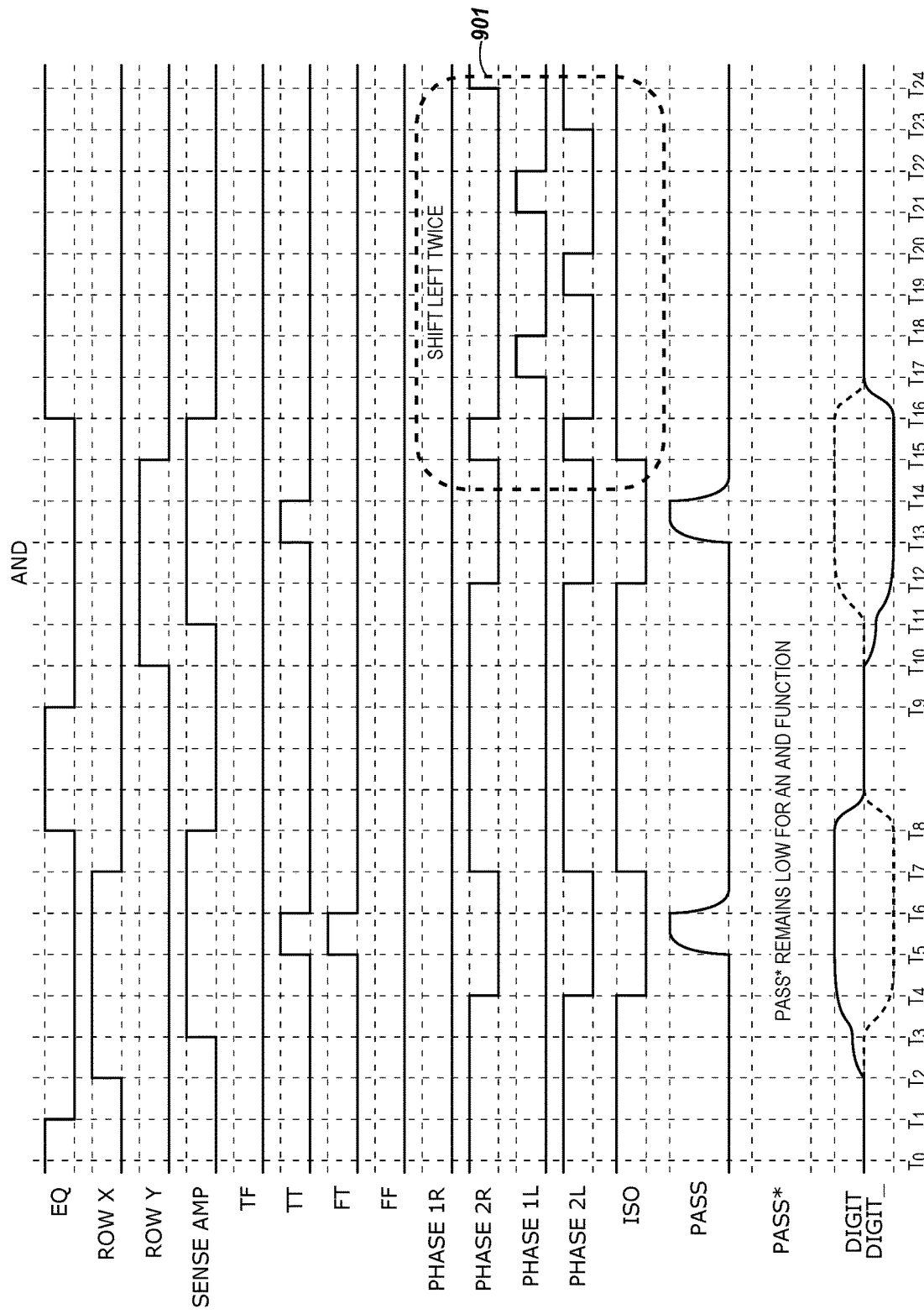
FIG. 9 illustrates a timing diagram associated with performing a logical operation and a shifting operation using the sensing circuitry in accordance with a number of embodiments of the present disclosure.

FIG. 9 illustrates a timing diagram associated with performing a logical AND operation and a shifting operation using the sensing circuitry in accordance with a number of embodiments of the present disclosure. FIG. 9 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 626 shown in FIG. 6). The ROW X and ROW Y signals correspond to signals applied to respective access line (e.g., access lines 604-X and 604-Y shown in FIG. 6) to access a selected cell (or row of cells). The SENSE AMP signal corresponds to a signal used to enable/disable a sense amplifier (e.g., sense amplifier 706). The TF, TT, FT, and FF signals correspond to logic selection control signals such as those shown in FIG. 7 (e.g., signals coupled to logic selection transistors 762, 752, 754, and 764). The PHASE 1R, PHASE 2R, PHASE 1L, and PHASE 2L signals correspond to the control signals (e.g., clock signals) provided to respective control lines 782, 783, 791 and 792 shown in FIG. 7. The ISO signal corresponds to the signal coupled to the gates of the isolation transistors 750-1 and 750-2 shown in FIG. 7. The PASS signal corresponds to the signal coupled to the gates of pass transistors 707-1 and 707-2 shown in FIG. 7, and the PASS* signal corresponds to the signal coupled to the gates of the swap transistors 742. The DIGIT and DIGIT_ signals correspond to the signals present on the respective sense lines 705-1 (e.g., DIGIT (n)) and 705-2 (e.g., DIGIT (n)_).

The timing diagram shown in FIG. 9 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 9, reference will be made to the sensing circuitry described in FIG. 7. For example, the logical operation described in FIG. 9 can include storing the data value of the ROW X memory cell (e.g., the "ROW X data value) in the latch of the corresponding compute component 731 (e.g., the "A" data value), which can be referred to as the accumulator 731, storing the data value of the ROW Y memory cell (e.g., the "ROW Y data value") in the latch of the corresponding sense amplifier 706 (e.g., the "B" data value), and performing a selected logical operation (e.g., a logical AND operation in this example) on the ROW X data value and the ROW Y data value, with the result of the selected logical operation being stored in the latch of the compute component 731.

As shown in FIG. 9, at time $T_1$, equilibration of the sense amplifier 706 is disabled (e.g., EQ goes low). At time $T_2$, ROW X goes high to access (e.g., select) the ROW X memory cell. At time $T_3$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW X data value (e.g., as shown by the DIGIT and DIGIT_ signals), and the ROW X data value is latched in the sense amplifier 706. At time $T_4$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_4$, ISO goes low, which disables isolation transistors 750-1 and 750-2. At time $T_5$, TT and FT are enabled (e.g., go high), which results in PASS going high (e.g., since either transistor 752 or 754 will conduct depending on which of node ST2 (corresponding to node "S" in FIG. 6) or node SF2 (corresponding to node "S*" in FIG. 6) was high when ISO was disabled at time $T_4$ (recall that when ISO is disabled, the voltages of the nodes ST2 and SF2 reside dynamically on the gates of the respective enable transistors 752 and 754). PASS going high enables the pass transistors 707-1 and 707-2 such that the DIGIT and DIGIT_ signals, which correspond to the ROW X data value, are provided to the respective compute component nodes ST2 and SF2. At time $T_6$, TT and FT are disabled, which results in PASS going low, which disables the pass transistors 707-1 and 707-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 731 such that the ROW X data value is latched therein. Enabling ISO at time $T_7$ again couples nodes ST2 and SF2 to the gates of the enable transistors 752, 754, 762, and 764. At time $T_8$, equilibration is enabled (e.g., EQ goes high such that DIGIT and DIGIT_ are driven to an equilibrate voltage such as $V_{DD}/2$) and the sense amplifier 706 is disabled (e.g., SENSE AMP goes low).

With the ROW X data value latched in the compute component 731, equilibration is disabled (e.g., EQ goes low at time $T_9$). At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_{12}$, ISO goes low, which disables isolation transistors 750-1 and 750-2. Since the desired logical operation in this example is an AND operation, at time $T_{13}$, TT is enabled while TF, FT and FF remain disabled (as shown in TABLE 8-2, FF=0, FT=0, TF=0, and TT=1 corresponds to a logical AND operation). Whether enabling TT results in PASS going high depends on the value stored in the compute component 731 when ISO is disabled at time $T_{12}$. For example, enable transistor 752 will conduct if node ST2 was high when ISO is disabled, and enable transistor will not conduct if node ST2 was low when ISO was disabled at time $T_{12}$.

In this example, if PASS goes high at time $T_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time $T_{14}$, TT is disabled, which results in PASS going (or remaining) low, such that the pass transistors 707-1 and 707-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the AND operation (e.g., "A" AND "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_are driven to an equilibrate voltage) and the sense amplifier 706 is disabled (e.g., SENSE AMP goes low).

The result of the AND operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 801) signaling associated with shifting data (e.g., from a compute component 731 to an adjacent compute component 731). The example shown in FIG. 9 illustrates two left shifts such that a data value stored in a compute component corresponding to column "N" is shifted left to a compute component corresponding to column "N−2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 789 to conduct, which causes the data value at node SF1 to move left to node SF2 of a left-adjacent compute component 731. PHASE 2L is subsequently enabled at time $T_{19}$ and disabled at time $T_{20}$. Enabling PHASE 2L causes transistor 790 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 10 illustrates a timing diagram associated with performing a logical XOR operation and a shifting operation using the sensing circuitry in accordance with a number of embodiments of the present disclosure. FIG. 10 includes the same waveforms described in FIG. 9 above. However, the timing diagram shown in FIG. 10 is associated with performing a logical XOR operation on a ROW X data value and a ROW Y data value (e.g., as opposed to a logical AND operation). Reference will again be made to the sensing circuitry described in FIG. 7.

The signaling indicated at times $T_0$ through $T_9$ for FIG. 10 are the same as for FIG. 9 and will not be repeated here. As such, at time $T_9$, EQ is disabled with the ROW X data value being latched in the compute component 731. At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component 731 may be overwritten during the logical operation. Also, at time $T_{12}$, ISO goes low, which disables isolation transistors 750-1 and 750-2. Since the desired logical operation in this example is an XOR operation, at time $T_{13}$, TF and FT are enabled while TT and FF remain disabled (as shown in TABLE 10-2, FF=0, FT=1, TF=1, and TT=0 corresponds to a logical XOR (e.g., "AXB") operation). Whether enabling TF and FT results in PASS or PASS* going high depends on the value stored in the compute component 731 when ISO is disabled at time $T_{12}$. For example, enable transistor 762 will conduct if node ST2 was high when ISO is disabled, and enable transistor 762 will not conduct if node ST2 was low when ISO was disabled at time $T_{12}$. Similarly, enable transistor 754 will conduct if node SF2 was high when ISO is disabled, and enable transistor 754 will not conduct if node SF2 was low when ISO is disabled.

In this example, if PASS goes high at time $T_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same. In this example, if PASS* goes high at time $T_{13}$, the swap transistors 742 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 731 (e.g., the ROW X data value) may be flipped, depending on the value of DIGIT and DIGIT_ (e.g., the ROW Y data value). In this example, if PASS* stays low at time $T_{13}$, the swap transistors 742 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time $T_{14}$, TF and FT are disabled, which results in PASS and PASS* going (or remaining) low, such that the pass transistors 707-1 and 707-2 and swap transistors 742 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the XOR operation (e.g., "A" XOR "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the XOR operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 10 also includes (e.g., at 1001) signaling associated with shifting data (e.g., from a compute component 731 to an adjacent compute component 731). The example shown in FIG. 10 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 781 to conduct, which causes the data value at node ST1 to move right to node ST2 of a right-adjacent compute component 731. PHASE 2R is subsequently enabled at time $T_{19}$ and disabled at time $T_{20}$. Enabling PHASE 2R causes transistor 786 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 9 and 10 include the logical operation result being stored in the compute component (e.g., 371), sensing circuitry in accordance with embodiments described herein can be operated to perform logical operations with the result being initially stored in the sense amplifier (e.g., as illustrated in FIG. 9). Also, embodiments are not limited to the "AND" and "XOR" logical operation examples described in FIGS. 9 and 10, respectively. For example, sensing circuitry in accordance with embodiments of the present disclosure (e.g., 750 shown in FIG. 7) can be controlled to perform various other logical operations such as those shown in Table 10-2.

While example embodiments including various combinations and configurations of sensing circuitry, sense amps, compute components, dynamic latches, isolation devices, and/or shift circuitry have been illustrated and described herein, embodiments of the present disclosure are not limited to those combinations explicitly recited herein. Other combinations and configurations of the sensing circuitry, sense amps, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    reading addresses in a number of registers;
    identifying a first portion and a second portion of an array of memory cells indicated by the read addresses;
    executing instructions stored in the first portion;
    storing a result of the executed instructions within memory cells of the first portion;
    preventing data from being copied from the first portion to the second portion in response to execution of an instruction that is not stored in the first portion; and
    allowing access to the second portion of the array.

2. The method of claim 1, comprising modifying the address in the number of registers that modifies which memory cells of the array that make up the first portion.

3. The method of claim 1, wherein a first address of a first of the number of registers indicates a first row of cells of the first portion.

4. The method of claim 3, wherein a second address of a second of the number of registers indicates a last row of cells of the first portion.

5. The method of claim 1, comprising:
    decrypting data as the data is initially read and written into the first portion; and
    leaving the data unencrypted in the first portion.

6. The method of claim 1, comprising preventing a result of executing DRAM instructions that originated external to the first portion from being stored in the first portion.

7. The method of claim 1, comprising preventing instructions stored in the first portion from being executed in a location external to the first portion.

8. The method of claim 1, comprising clearing data from the first portion in response to a system reset being performed.

9. The method of claim 8, comprising clearing the number of registers in response to the system reset being performed.

10. An apparatus, comprising:
    an array of memory cells, comprising:
        a first portion of memory cells that are inaccessible by devices external to the apparatus and that are configured to store a first set of data and a set of instructions;
        a second portion of memory cells that are accessible by the devices external to the apparatus and that are configured to store a second set of data;
        a set of address registers, wherein the set of address registers indicate which portion of the array is the inaccessible first portion; and
    a controller coupled to the array, the controller configured to:
        read addresses in the set of address registers;
        identify the first portion using the read addresses;
        execute instructions stored in the first portion, and store a result of the executed instructions within memory cells of the first portion;
        prevent data from being copied from the second portion to the first portion in response to execution of an instruction that is not stored in the first portion; and
        allow data to be copied from the second portion to the first portion in response to execution of an instruction that is stored in the first portion.

11. The apparatus of claim 10, wherein the controller is further configured to modify the read addresses by executing instructions from the first portion.

12. The apparatus of claim 10, wherein the set of address of registers comprise access control registers.

13. The apparatus of claim 12, wherein the access control registers comprise row access control registers.

14. The apparatus of claim 10, wherein the controller is further configured to:
    allow a result of an execution of instructions stored in the first portion to be written to or read from the second portion; and
    not allow a result of execution of instructions stored in the second portion to be written to the first portion.

15. The apparatus of claim 14, wherein the controller configured to allow execution of the instructions stored in the first portion is based on addresses stored in the set of address registers.

16. The apparatus of claim 14, wherein:
    prevention of the instructions from being executed from the second portion is based on addresses stored in the set of address registers; and
    the controller is configured to allow data to be copied into the first portion only by running the instructions executed from the first portion.

17. A method, comprising:
    reading addresses in a number of registers;
    identifying a first portion and a second portion of an array of memory cells indicated by the read addresses;
    executing instructions stored in the first portion, and storing a result of the executed instructions within memory cells of the first portion; and
    preventing:
        data from being copied from the first portion to the second portion in response to execution of an instruction that is not stored in the first portion; and
        data from being copied from the second portion to the first portion in response to execution of an instruction that is not stored in the first portion.

18. The method of claim 17, further comprising:
    allowing instructions to be executed from the second portion only in response to the instructions having no target in the first portion; and
    preventing, in response to execution of an instruction that is not stored in the first portion:
        data from being copied from the first portion to the second portion in response to execution of an instruction that is not stored in the first portion; and
        data from being copied from the second portion to the first portion in response to execution of an instruction that is not stored in the first portion.

19. The method claim 17, wherein, in response to the addresses associated with each of the number of registers being modified, modifying data stored in the first portion of the array.

* * * * *